(12) United States Patent
Chang et al.

(10) Patent No.: US 9,007,555 B2
(45) Date of Patent: Apr. 14, 2015

(54) LIQUID CRYSTAL DISPLAY PANEL AND PIXEL STRUCTURE

(75) Inventors: Wen-Zong Chang, Kaohsiung (TW); Shih-Chyuan Fan-Jiang, Taipei (TW); Hsiao-Wei Cheng, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 169 days.

(21) Appl. No.: 13/537,045

(22) Filed: Jun. 28, 2012

(65) Prior Publication Data

US 2013/0257700 A1    Oct. 3, 2013

(30) Foreign Application Priority Data

Mar. 28, 2012  (TW) ............................. 101110786 A

(51) Int. Cl.
  *G02F 1/1343* (2006.01)
  *G02F 1/1362* (2006.01)
  *H01L 27/15* (2006.01)

(52) U.S. Cl.
  CPC ........ *G02F 1/134363* (2013.01); *G02F 1/1362* (2013.01); *H01L 27/15* (2013.01); *G02F 2001/134372* (2013.01)

(58) Field of Classification Search
  USPC ........................................................ 349/141
  See application file for complete search history.

(56) References Cited

U.S. PATENT DOCUMENTS

| 7,855,772 B2 | 12/2010 | Wang et al. |
| 8,013,968 B2 | 9/2011 | Jeong et al. |
| 8,102,479 B2 | 1/2012 | Song et al. |
| 2005/0099573 A1* | 5/2005 | Kubo et al. ................. 349/146 |
| 2009/0040407 A1 | 2/2009 | Kim |
| 2009/0268144 A1* | 10/2009 | Lee et al. ................... 349/139 |

(Continued)

FOREIGN PATENT DOCUMENTS

| CN | 101604100 | 12/2009 |
| CN | 101650505 | 2/2010 |

(Continued)

OTHER PUBLICATIONS

"Office Action of Taiwan Counterpart Application", issued on Jul. 31, 2014, p. 1-p. 8.

(Continued)

*Primary Examiner* — Lauren Nguyen
*Assistant Examiner* — Anthony G Quash
(74) *Attorney, Agent, or Firm* — Jianq Chyun IP Office

(57) ABSTRACT

A liquid crystal display panel including a first substrate, scan lines extending along a first direction, data lines, active devices, pixel electrodes, common electrodes, a second substrate and a liquid crystal layer is provided. The pixel electrodes are respectively disposed in sub-pixel regions and coupled to the corresponding active devices. The common electrodes are respectively disposed corresponding to the pixel electrodes. Each common electrode or each pixel electrode includes plural stripe electrodes arranged side by side. Each stripe electrode includes a first section and a second section respectively disposed on two opposite sides of a reference axis, wherein a major axis of the first section forms an included angle with a major axis of the second section. The included angles of the stripe electrodes in each sub-pixel region are gradually varied along the first direction. The liquid crystal layer is disposed between the first substrate and the second substrate.

15 Claims, 8 Drawing Sheets

(56) References Cited

U.S. PATENT DOCUMENTS

| | | |
|---|---|---|
| 2009/0310073 A1 | 12/2009 | Jeong et al. |
| 2010/0038644 A1* | 2/2010 | Song et al. .................. 257/59 |
| 2010/0157229 A1* | 6/2010 | Sakurai et al. ............. 349/141 |
| 2011/0121303 A1* | 5/2011 | Kim .............................. 257/59 |
| 2012/0169981 A1* | 7/2012 | Murata et al. .............. 349/138 |
| 2012/0200552 A1* | 8/2012 | Jung et al. .................. 345/211 |
| 2013/0088668 A1* | 4/2013 | Seo et al. ..................... 349/96 |

FOREIGN PATENT DOCUMENTS

| | | |
|---|---|---|
| CN | 101750805 | 6/2010 |
| TW | 200516306 | 5/2005 |
| TW | 200825593 | 6/2008 |
| TW | 201030435 | 8/2010 |

OTHER PUBLICATIONS

"Office Action of China Counterpart Application", issued on Apr. 30, 2014, p. 1-p. 7.

* cited by examiner

LIQUID CRYSTAL DISPLAY PANEL AND PIXEL STRUCTURE

CROSS-REFERENCE TO RELATED APPLICATION

This application claims the priority benefit of Taiwan application serial no. 101110786, filed on Mar. 28, 2012. The entirety of the above-mentioned patent application is hereby incorporated by reference herein and made a part of this specification.

BACKGROUND OF THE INVENTION

1. Field of the Invention

The invention relates to a display panel and pixel structure thereof, and more particularly, to a fringe field switching (FFS) liquid crystal display panel and pixel structure thereof.

2. Description of Related Art

Recently, with continuing maturation of photoelectric technology and semiconductor fabrication, development of flat panel displays is booming. Among the flat panel displays, liquid crystal displays (LCDs) free of harmful radiation and characterized by low operating voltage, light weight, and small volume have gradually replaced conventional cathode ray tube (CRT) displays and have become mainstream display products. However, the LCDs are still subject to the limited viewing angles. At this current stage, displays capable of satisfying the requirement for wide viewing angle include a twisted nematic (TN) LCD equipped with a wide viewing film, an in-plane switching (IPS) LCD, a fringe field switching (FFS) LCD, a multi-domain vertical alignment (MVA) display, and so on.

The existing FFS LCD encounters the color shift issue. Specifically, red, blue, and green pixels in large viewing angle may be accompanied with color shift to different extent. More specifically, the existing FFS LCD is provided with pixel structures in single domain, wherein an electric field along a single direction is provided between a pixel electrode and a common electrode in each of the pixel structures, and the liquid crystal molecules of the pixel structures are aligned in a single orientation. Therefore, a color level of an image displayed on the LCD observed in a large viewing angle (e.g. 60 degrees) appears yellowish or blueish in relative to that observed in a normal viewing angle (i.e. 0 degree). The existing FFS LCD with pixel structures in single domain encounters the color shift issue in large viewing angles. Thus, an acceptable range of viewing angle of the existing FFS LCD is restricted, and the display quality goes inferior.

SUMMARY

The present invention is directed to a liquid crystal display panel with desirable display quality.

The present invention provides a pixel structure capable of eliminating color shift in displaying image.

As embodied and broadly described herein, a liquid crystal display panel includes a first substrate, scan lines extending along a first direction, data lines, active devices, pixel electrodes, common electrodes, a second substrate and a liquid crystal layer is provided. The scan lines are disposed on the first substrate and extending along a first direction. The data lines are disposed on the first substrate and intersected with the scan lines. Plural sub-pixel regions are defined on the first substrate by the scan lines and the data lines. The active devices are disposed on the first substrate and coupled to the scan lines and the data lines correspondingly. The pixel electrodes are respectively disposed in the sub-pixel regions and coupled to the corresponding active devices. The common electrodes are disposed corresponding to the pixel electrodes, wherein each of the common electrodes or each of the pixel electrodes includes plural stripe electrodes arranged side by side. Each of the stripe electrodes includes a first section and a second section respectively disposed on two opposite sides of a reference axis, wherein a major axis of the first section forms an included angle with a major axis of the second section. The included angles of the stripe electrodes in each sub-pixel region are gradually varied along the first direction. The liquid crystal layer is disposed between the first substrate and the second substrate.

In an embodiment of the present invention, the sub-pixel regions comprises a first sub-pixel region and a second sub-pixel region adjacent to each other along the first direction, and a variation trend of the included angles in the first sub-pixel region is opposite to a variation trend of the included angles in the second sub-pixel region.

In an embodiment of the present invention, an outermost stripe electrode in the first sub-pixel region is adjacent to an outermost stripe electrode in the second sub-pixel region, and the included angle of the outermost stripe electrode in the first sub-pixel region is substantially equal to the included angle of the outermost stripe electrode in the second sub-pixel region.

In an embodiment of the present invention, an area of the first sub-pixel region is greater than an area of the second sub-pixel region, and the liquid crystal display panel is provided with a contact window located in the first sub-pixel region.

In an embodiment of the present invention, the aperture ratio of the first sub-pixel region is substantially equal to the aperture ratio of the second sub-pixel region.

In an embodiment of the present invention, the liquid crystal display panel further comprises a plurality of common lines disposed on the first substrate and extending along the first direction. The contact window is coupled between the corresponding common line and the corresponding common electrode.

In an embodiment of the present invention, a liquid crystal display panel further comprises a plurality of common lines electrically connected to the common electrodes.

In an embodiment of the present invention, the included angles in each of the plurality of sub-pixels are gradually decreased along the first direction.

In an embodiment of the present invention, the included angles in each of the plurality of sub-pixels are gradually decreased and gradually increased along the first direction, alternately.

In an embodiment of the present invention, the included angles in each of the plurality of sub-pixels are gradually varied with the same interval.

In an embodiment of the present invention, the reference axis is substantially parallel to the first direction.

A pixel structure including a substrate, a scan line, a data line, an active device, a pixel electrode, and a common electrode is also provided. The scan line is disposed on the substrate and extending along a first direction. The data line is disposed on the first substrate and intersected with the scan line. The active device is disposed on the substrate and coupled to the scan line and the data line. The pixel electrode is electrically connected to the active device. The common electrode is disposed corresponding to the pixel electrode, wherein one of the common electrode and the pixel electrode comprises a plurality of stripe electrodes arranged side by side. Each of the stripe electrodes comprises a first section and a second section respectively disposed on two opposite sides of a reference axis. A major axis of the first section forms an included angle with a major axis of the second section. The included angles of the stripe electrodes are gradually varied along the first direction.

In an embodiment of the present invention, the included angles are gradually decreased along the first direction.

In an embodiment of the present invention, the included angles are gradually decreased and gradually increased along the first direction, alternately.

In an embodiment of the present invention, the included angles are gradually varied with the same interval.

In an embodiment of the present invention, the reference axis is substantially parallel to the first direction.

The color shift of display image in large viewing angle can be effectively eliminated in the pixel structure of the present invention by the stripe electrodes arranged side by side and having gradually varied included angles along the first direction. Thus, the liquid crystal display panel adopting the pixel structure of the present invention can provide favorable display quality.

In order to make the aforementioned features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
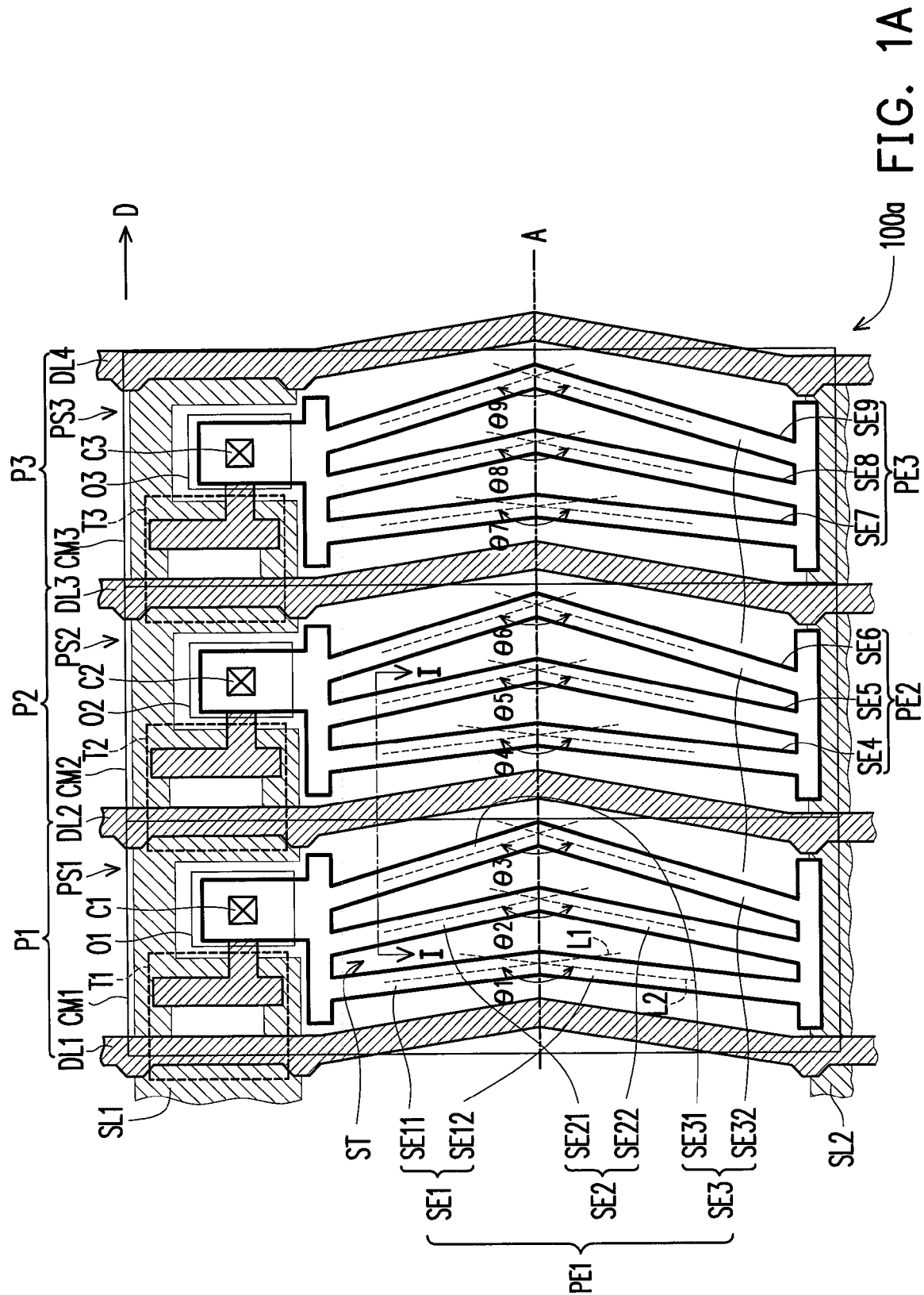
FIG. 1A is a schematic top view of a liquid crystal display panel according to an embodiment of the present invention.
Figure 1B:
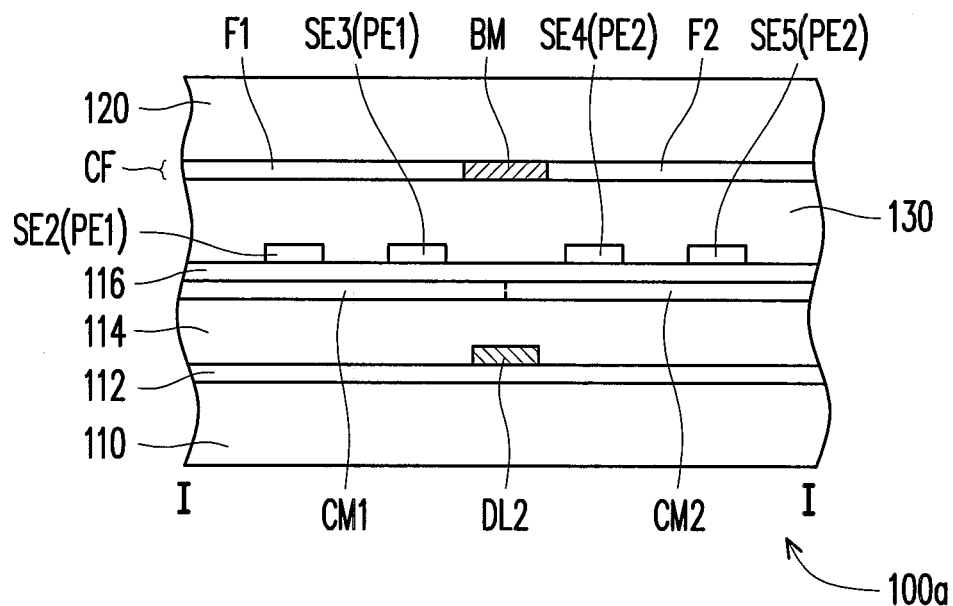
FIG. 1B is a schematic cross-sectional view taken along line I-I in FIG. 1A.

FIG. 1A is a schematic top view of a liquid crystal display panel according to an embodiment of the present invention. FIG. 1B is a schematic cross-sectional view taken along line I-I in FIG. 1A. For purposes of illustration, some elements shown in FIG. 1B are omitted in FIG. 1A. Referring to FIG. 1A and FIG. 1B, the liquid crystal display panel 100a includes a first substrate 110, a plurality of scan lines (two scan lines SL1 and SL2 are schematically depicted in FIG. 1A), a plurality of data lines (four data lines DL1, DL2, DL3 and DL4 are schematically depicted in FIG. 1A), a plurality of active devices (three active devices T1, T2 and T3 are sche-matically depicted in FIG. 1A), a plurality of pixel electrodes (three pixel electrodes PE1, PE2 and PE3 are schematically depicted in FIG. 1A), a plurality of common electrodes (three common electrodes CM1, CM2 and CM3 are schematically depicted in FIG. 1A), a second substrate 120, and a liquid crystal layer 130 disposed between the first substrate 110 and the second substrate 120. As shown in FIG. 1A, three pixel structures PS1, PS2 and PS3 of the liquid crystal display panel are illustrated.

More specifically, the scan lines SL1 and SL2 are disposed on the first substrate 110 and extending along a first direction D. The data lines DL1, DL2, DL3 and DL4 are disposed on the first substrate 110 and intersected with the scan lines SL1 and SL2. a plurality of sub-pixel regions (three sub-pixel regions P1, P2 and P3 are schematically depicted in FIG. 1A) are defined on the first substrate 110 by the scan lines SL1, SL2 and the data lines DL1, DL2, DL3 and DL4. Herein, the data lines DL1, DL2, DL3 and DL4 are disposed across the scan lines SL1 and SL2, and an insulating layer 112 is sandwiched between the scan lines SL1, SL2 and the data lines DL1, DL2, DL3 and DL4. The scan lines SL1, SL2 and the data lines DL1, DL2, DL3 and DL4 are usually fabricated by using metal material for conductivity. However, in other embodiments, the scan lines SL1, SL2, and the data lines DL1, DL2, DL3 and DL4 may comprise other conductive materials. For example, the conductive materials may include an alloy, metal nitride, metal oxide, metal oxynitride, other appropriate materials, or a layer in which a metal material and other conductive materials are stacked together.

The active devices T1, T2 and T3 are disposed on the first substrate 110 and coupled to the scan lines SL1, SL2 and the data lines DL1, DL2, DL3 and DL4 correspondingly. The pixel electrodes PE1, PE2 and PE3 are respectively disposed in the sub-pixel regions P1, P2 and P3, and coupled to the corresponding active devices T1, T2 and T3. As shown in FIG. 1A and FIG. 1B, the pixel electrodes PE1, PE2 and PE3 are respectively electrically connected to the active devices T1, T2 and T3 via contact windows C1, C2 and C3, which penetrates insulating layers 114 and 116. The common electrodes CM1, CM2 and CM3 are disposed corresponding to the pixel electrodes PE1, PE2 and PE3, wherein the common electrodes CM1, CM2 and CM3 are disposed on the insulating layer 114, the pixel electrodes PE1, PE2 and PE3 are correspondingly disposed over the common electrodes CM1, CM2 and CM3, and the pixel electrodes PE1, PE2 and PE3 are isolated from the common electrodes CM1, CM2 and CM3 by the insulating layer 116. Herein, the common electrodes CM1, CM2 and CM3 are respectively provided with openings O1, O2 and O3, such that the contact windows C1, C2 and C3 penetrating the insulation layers 114 and 116 are not in electrical contact with the common electrodes CM1, CM2 and CM3. Each pixel electrode PE1 (or PE2 or PE3) comprises a plurality of stripe electrodes SE1, SE2 and SE3 (or SE4, SE5 and SE6, or SE7, SE8 and SE9). A pixel structure (e.g. PS1) comprises a scan line (e.g. SL1), a data line (e.g. DL1), an active device (e.g. T1), a pixel electrode (e.g. PE1) and a common electrode (e.g. CM1).

Each stripe electrode SE1 (or SE2 or SE3) includes a first section SE11 (or SE21 or SE31) and a second section SE12 (or SE22 or SE32) respectively disposed on two opposite sides of a reference axis A, wherein a major axis L1 of the first section SE11 (or SE21 or SE31) forms an included angle θ1 (or θ2 or θ3) with a major axis L2 of the second section SE12 (or SE22 or SE32). The included angles θ1, θ2, θ3 (or θ4, θ5, θ6, or θ7, θ8, θ9) of the stripe electrodes SE1, SE2, SE3 (or SE4、SE5、SE6, or SE7、SE8、SE9) in the sub-pixel region P1 (or P2 or P3) are gradually varied along the first direction D. As shown in FIG. 1, the included angle θ1 is greater than the included angle θ2, and the included angle θ2 is greater than the included angle θ3, wherein the included angles θ1, θ2 and θ3 are gradually decreased with the same interval. For example, the included angles θ1, θ2 and θ3 are respectively 170 degrees, 166 degrees and 162 degrees. The included angles θ4, θ5 and θ6 are gradually decreased with the same interval. For example, the included angles θ4, θ5 and θ6 are respectively 170 degrees, 166 degrees and 162 degrees. In addition, the included angles θ7, θ8 and θ9 are gradually decreased with the same interval. For example, the included angles θ7, θ8 and θ9 are respectively 170 degrees, 166 degrees and 162 degrees. However, in other embodiments, the included angles θ1, θ2 and θ3 can be gradually increased with the same interval. Variations of the included angles θ4、θ5、θ6 and the included angles θ7、θ8、θ9 are substantially identical with that of the included angles θ1、θ2、θ3. In other words, as illustrated in the present embodiment, the included angles θ1、θ2、θ3 (or θ4, θ5, θ6, or θ7, θ8, θ9) are defined from large to small.

Furthermore, the first portion SE11 (or SE21 or SE31) and the second portion SE12 (SE22 or SE32) of each stripe electrode SE1 (or SE2 or SE3) are extended along different directions, such that the slits ST among the stripe electrodes SE1, SE2 and SE3 of the pixel electrode PE1 are in two different extending directions to form multi domains in the sub-pixel region P1. Similarly, sub-pixels P2 and P3 are also provided with multi domains. According to the present embodiment, the common electrodes CM1, CM2 and CM3 are disposed below the pixel electrodes PE1, PE2 and PE3, and each pixel electrode PE1 (or PE2 or PE3) comprises the stripe electrodes SE1~SE3 (or SE4~SE6 or SE7~SE9), for instance; however, the present invention is not limited thereto. According to another embodiment, the common electrodes CM1, CM2 and CM3 may be disposed above the pixel electrodes PE1, PE2 and PE3, and each common electrode CM1 (or CM2 or CM3) comprises the stripe electrodes SE1~SE3 (or SE4~SE6 or SE7~SE9) t.

In addition, referring to FIG. 1A and FIG. 1B, the liquid crystal display panel 100a further includes a color filter layer CF disposed on the second substrate 120. More specifically, the color filter layer CF includes a first color filter pattern F1 disposed corresponding to the sub-pixel region P1, a second color filter pattern F2 disposed corresponding to the sub-pixel region P2, and a third color filter pattern (not shown) disposed corresponding to the sub-pixel region P3. Herein, the first, second, and third color filter patterns F1, F2, and F3 may be red, green, and blue filter patterns, respectively. Moreover, the color filter layer CF may further include a light shielding layer BM correspondingly disposed among the color filter patterns, such as the first color filter pattern F1 and the second color filter pattern F2.

Figure 1C:
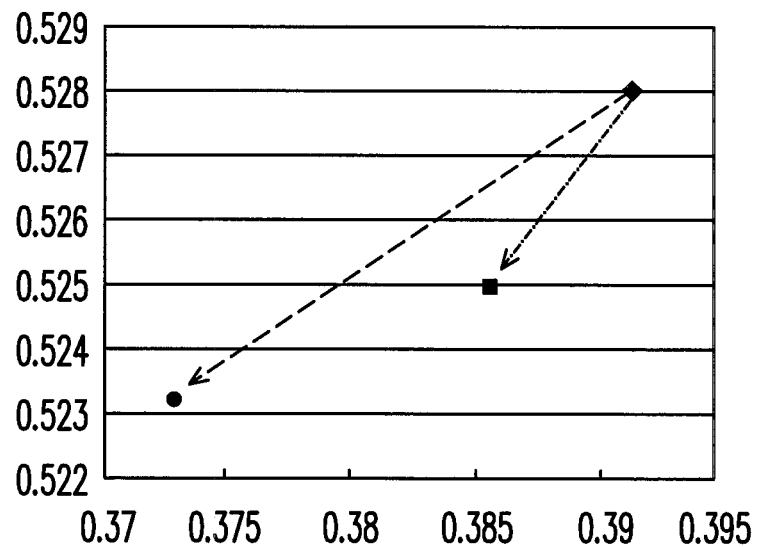
FIG. 1C through FIG. 1E respectively show the chroma coordinate of different color sub-pixels of the liquid crystal display panel 100a of FIG. 1A and a conventional single-domain sub-pixel region, when displaying an image in a large viewing angle.
Figure 1D:
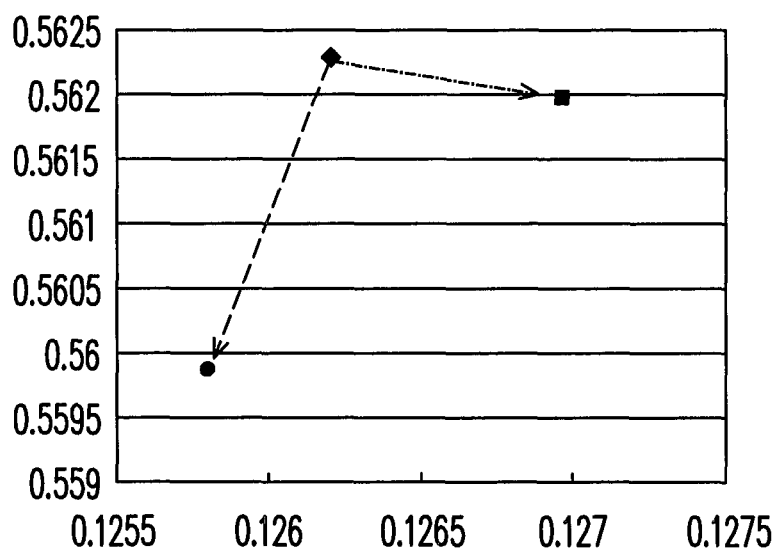
Figure 1E:
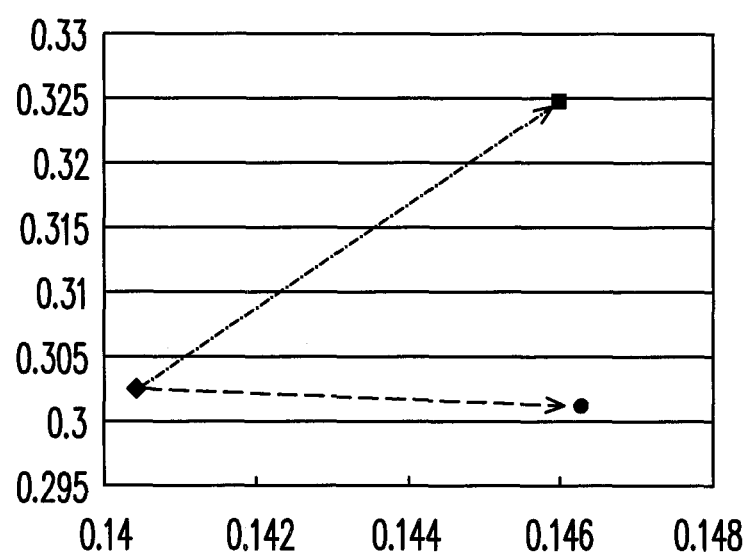

FIG. 1C through FIG. 1E respectively illustrate the color shift of red, green and blue sub-pixels in large viewing angle with respect to the liquid crystal display panel 100a of FIG. 1A and to a conventional liquid crystal display panel. The included angles θ1, θ2, θ3 (or θ4, θ5, θ6, or θ7, θ8, θ9) of the stripe electrodes SE1, SE2, SE3 (or SE4、SE5、SE6, or SE7、SE8、SE9) are gradually varied along the first direction D in the present embodiment, such that the chroma coordinate of the sub-pixels in large viewing angle can accordingly be adjusted. Referring to FIG. 1C, owing to the single domain design of sub-pixel regions, the chroma coordinate of the red sub-pixel of the conventional display panel in large viewing angle may shift from a chroma coordinate (represented as the rhombus pattern) of a red color filter pattern to a chroma coordinate (represented as the rectangular pattern) of a light blue color. In addition, referring to FIG. 1D, the chroma coordinate of the green sub-pixel of the conventional display panel in large viewing angle may shift from a chroma coordinate (represented as the rhombus pattern) of a green color filter pattern to a chroma coordinate (represented as the rectangular pattern) of a yellow color. And, referring to FIG. 1E, the chroma coordinate of the blue sub-pixel of the conventional display panel in large viewing angle may shift from a chroma coordinate (represented as the rhombus pattern) of a blue color filter pattern to a chroma coordinate (represented as the rectangular pattern) of a light yellow color. However, referring to FIG. 1C, to the liquid crystal display panel 100a of the present embodiment as shown in FIG. 1B, the chroma coordinate in large viewing angle of the red sub-pixel corresponding to for example the sub-pixel region P1 may shift from the chroma coordinate (represented as the rhombus pattern) of the first (red) color filter pattern F1 to a chroma coordinate (represented as the circular pattern) of a dark blue color. In addition, referring to FIG. 1D, the chroma coordinate in large viewing angle of the green sub-pixel corresponding to for example the sub-pixel region P2 may shift from the chroma coordinate (represented as the rhombus pattern) of the second (green) color filter pattern F2 to a chroma coordinate (represented as the circular pattern) of a blue color. And, referring to FIG. 1E, the chroma coordinate in large viewing angle of the blue sub-pixel corresponding to for example the sub-pixel region P3 may shift from the chroma coordinate (represented as the rhombus pattern) of the third (blue) color filter pattern to a chroma coordinate (represented as the circular pattern) of a dark yellow color. Thereby, color shift can be reduced in the present embodiment.

By gradually increasing or decreasing the included angles (e.g. θ1, θ2, θ3, or θ4, θ5, θ6, or θ7, θ8, θ9) of the stripe electrodes (e.g. SE1, SE2, SE3, or SE4, SE5, SE6, or SE7, SE8, SE9) of the pixel electrodes PE1, PE2 or PE3 corresponding to the color filter patterns (such as the first color filter pattern F1, the second color filter pattern F2, or the third color filter pattern) with the same interval along the first direction D, color compensation to the pixel structure PS1, PS2 or PS3 can be achieved, to effectively eliminate the color shift in large viewing angle. Thereby, the liquid crystal display panel 100a of the present embodiment can provide favorable display quality.

It should be mentioned that the reference numbers and some of the descriptions in the previous embodiment are applicable in the following embodiments. Identical or similar components in the previous and following embodiments are denoted by identical reference numbers, and the same descriptions in the previous and following embodiments are not reiterated herein. For a detailed description of this section, reference can be found in the previous embodiments of the invention; therefore, no further explanation is provided in the following embodiment.

Figure 2:
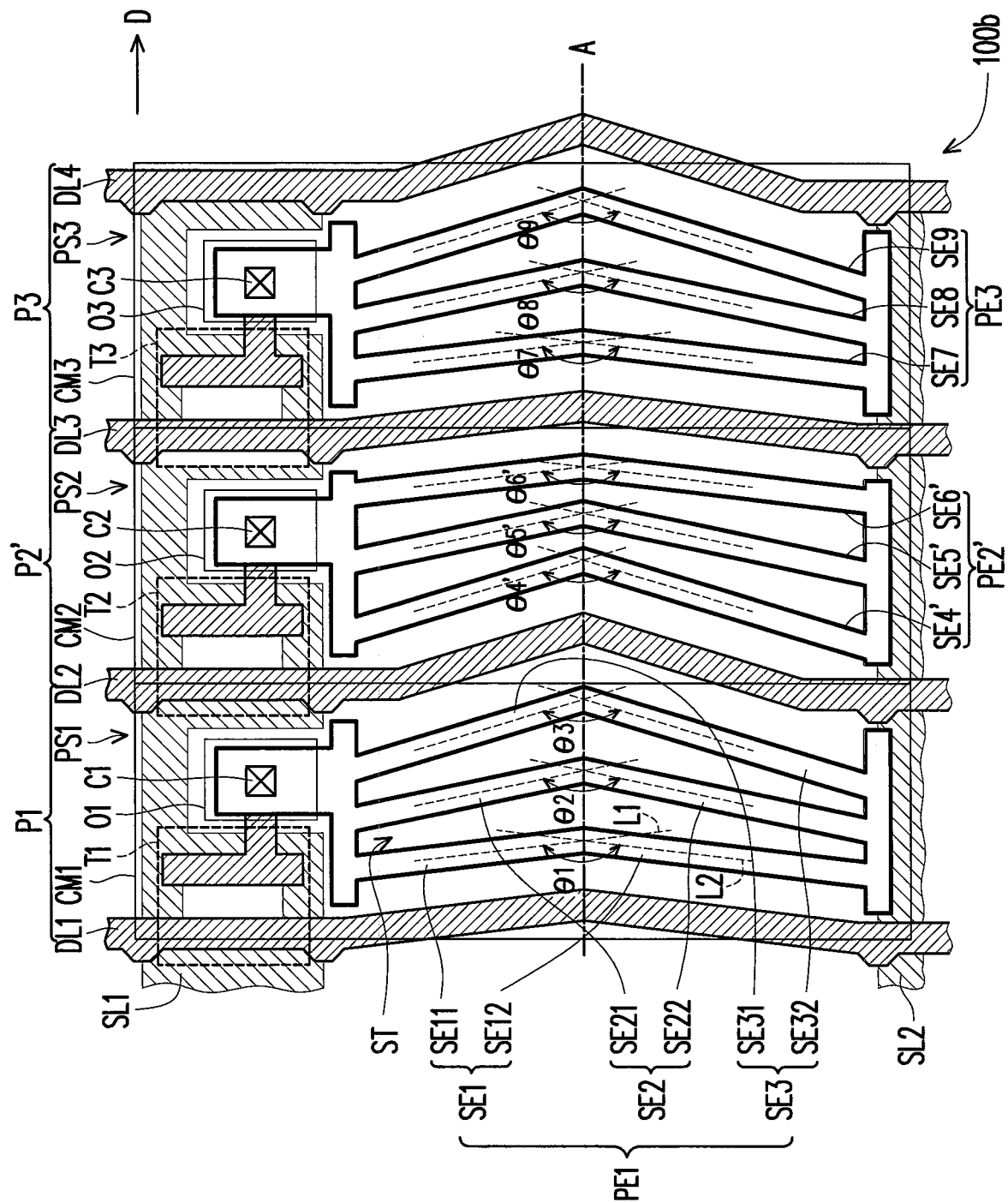
FIG. 2 is a schematic top view of a liquid crystal display panel according to another embodiment of the present invention.

FIG. 2 is a schematic top view of a liquid crystal display panel according to another embodiment of the present invention. Referring to FIG. 2, the liquid crystal display panel 100b is similar to the liquid crystal display panel 100a of FIG. 1A, except that: the variation trend of the included angles θ4', θ5' and θ6' of the stripe electrodes SE4', SE5' and SE6' in the sub-pixel region P2' is different from the variation trend of the included angles θ1, θ2 and θ3 of the stripe electrodes SE1, SE2 and SE3 in the sub-pixel region P1.

In the sub-pixel regions P1 and P2' along the first direction D, the variation trend of the included angles θ1, θ2 and θ3 in the sub-pixel region P1 is opposite to the included angles θ4', θ5' and θ6' in the sub-pixel region P2'. More specifically, the included angles θ1, θ2 and θ3 of the present embodiment are gradually decreased with the same interval, wherein the included angles θ1, θ2 and θ3 are respectively 170 degrees, 166 degrees and 162 degrees, for instance. The included angles θ4', θ5' and θ6' of the present embodiment are gradually increased with the same interval, wherein the included angles θ4', θ5' and θ6' are respectively 162 degrees, 166 degrees and 170 degrees, for instance. And, the included angles θ7, θ8 and θ9 of the present embodiment are gradually decreased with the same interval, wherein the included angles θ7, θ8 and θ9 are respectively 170 degrees, 166 degrees and 162 degrees, for instance. However, in another embodiment, the included angles θ1, θ2 and θ3 may be gradually increased with the same interval, the included angles θ4', θ5' and θ6' may be gradually decreased with the same interval, and the included angles θ7, θ8 and θ9 may be gradually increased with the same interval.

Furthermore, the outermost stripe electrode SE3 in the sub-pixel region P1 is adjacent to the outermost stripe electrode SE4' in the sub-pixel region P2', and the included angle θ3 of the outermost stripe electrode SE3 in the sub-pixel region P1 may be substantially equal to the included angle θ4' of the outermost stripe electrode SE4' in the sub-pixel region P2'. Accordingly, the included angles θ4', θ5' and θ6' may be respectively identical with the included angles θ3, θ2 and θ1. The variation trend of the included angles θ7, θ8 and θ9 is substantially identical with that of the included angles θ1, θ2 and θ3. And therefore, the variation trend from the included angles θ1, θ2 and θ3 in the sub-pixel region P1 to the included angles θ4', θ5' and θ6' in the sub-pixel region P2' is continuous, and, the variation trend from the included angles θ4', θ5' and θ6' in the sub-pixel region P2' to the included angles θ7, θ8 and θ9 in the sub-pixel region P3 is continuous.

Since the variation trend of the included angles θ1, θ2 and θ3 in the sub-pixel region P1 is opposite to the included angles θ4', θ5' and θ6' in the sub-pixel region P2', the area of the sub-pixel region P1 is greater than the area of the sub-pixel region P2'. An similarly, since the variation trend of the included angles θ7, θ8 and θ9 in the sub-pixel region P3 is opposite to the included angles θ4', θ5' and θ6' in the sub-pixel region P2', the area of the sub-pixel region P3 is greater than the area of the sub-pixel region P2'. In other words, the aperture ratio of the sub-pixel regions (e.g. the sub-pixel regions P1, P2' and P3) are different. Therefore, pixels with specific colors can be selectively arranged in those sub-pixel regions with greater or smaller areas to adjust the display effect according to the specifications of the liquid crystal display panel.

Figure 3:
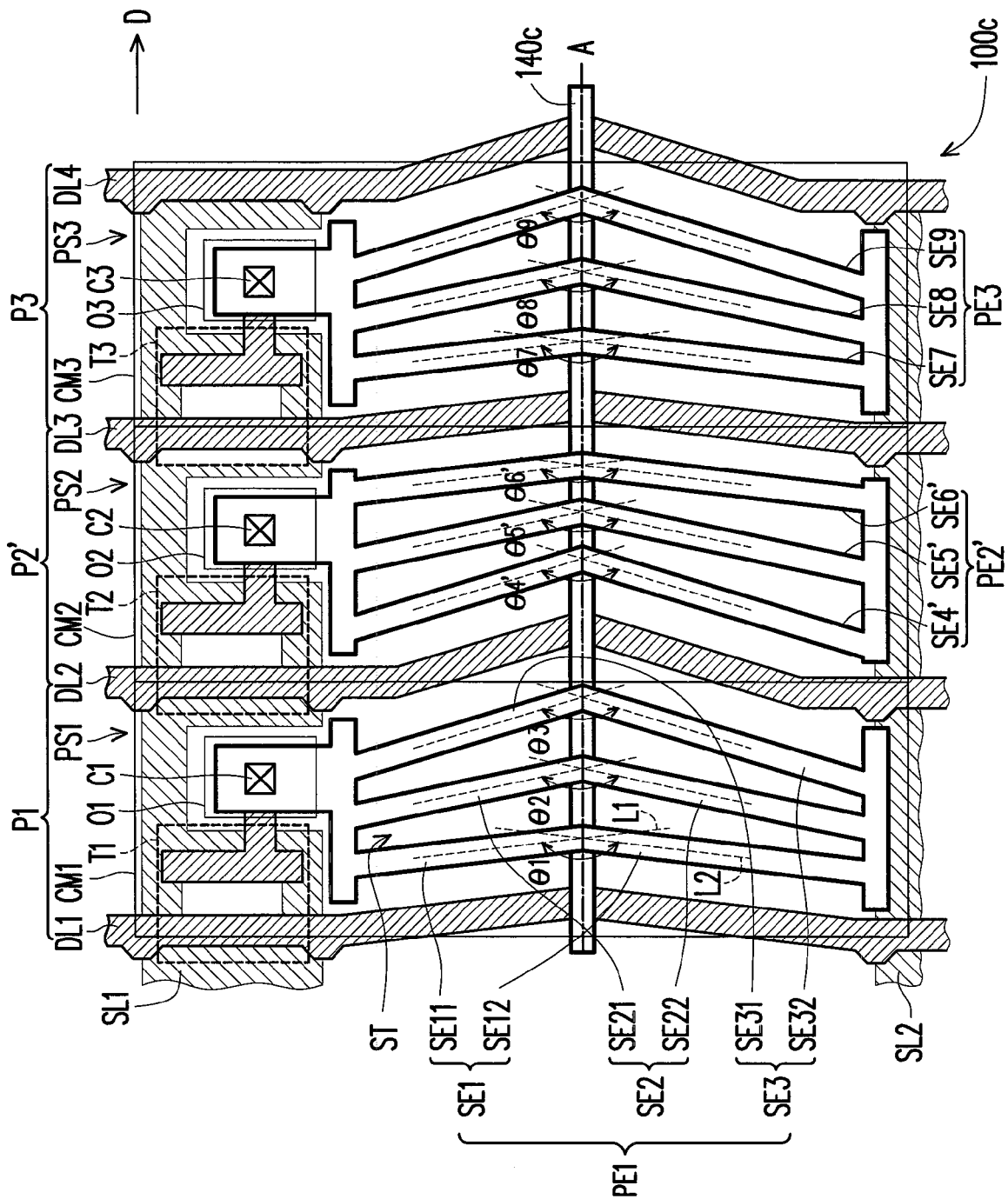
FIG. 3 is a schematic top view of a liquid crystal display panel according to further another embodiment of the present invention.

FIG. 3 is a schematic top view of a liquid crystal display panel according to further another embodiment of the present invention. The liquid crystal display panel 100c of the present embodiment is similar to the liquid crystal display panel 100b illustrated in FIG. 2, except that: the liquid crystal display panel 100c of the present embodiment includes a plurality of common lines, for example the common line 140c electrically connected to the common electrodes CM1, CM2 and CM3. The common line 140c can be disposed above or below the common electrodes CM1, CM2 and CM3, and electrically connected to the common electrodes CM1, CM2 and CM3. In addition, the common line 140c of the present embodiment is located above the data lines DL1, DL2, DL3 and DL4. The common line 140c is usually fabricated by using metal material for conductivity. However, in other embodiments, the common line 140c may comprise other conductive materials. For example, the conductive materials may include an alloy, metal oxide, other appropriate materials, or a layer in which a metal material and other conductive materials are stacked together. Owing to the common line 140c, the overall resistance of the common electrodes CM1, CM2 and CM3 can be reduced.

Figure 4A:
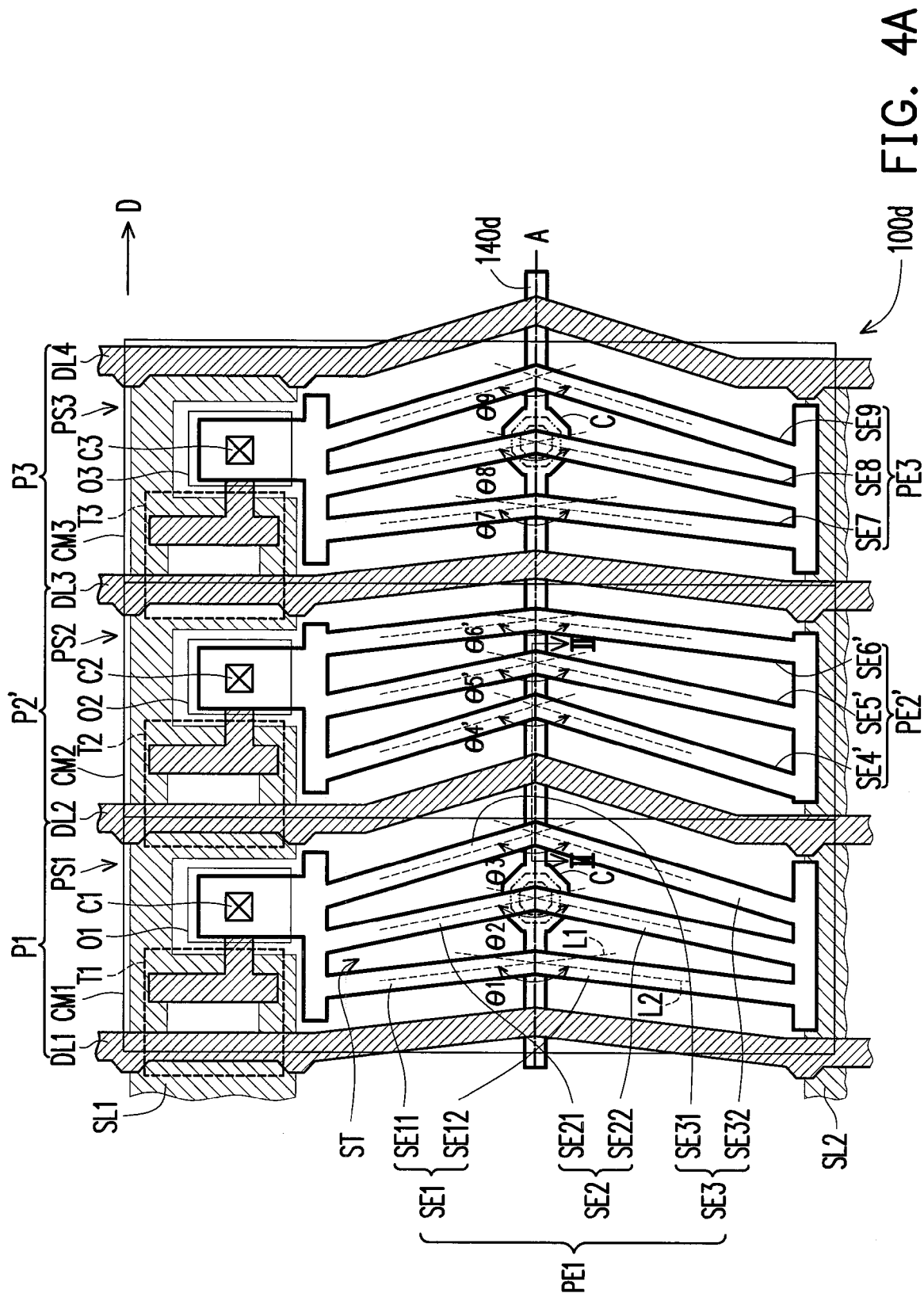
FIG. 4A is a schematic top view of a liquid crystal display panel according to further another embodiment of the present invention.
Figure 4B:
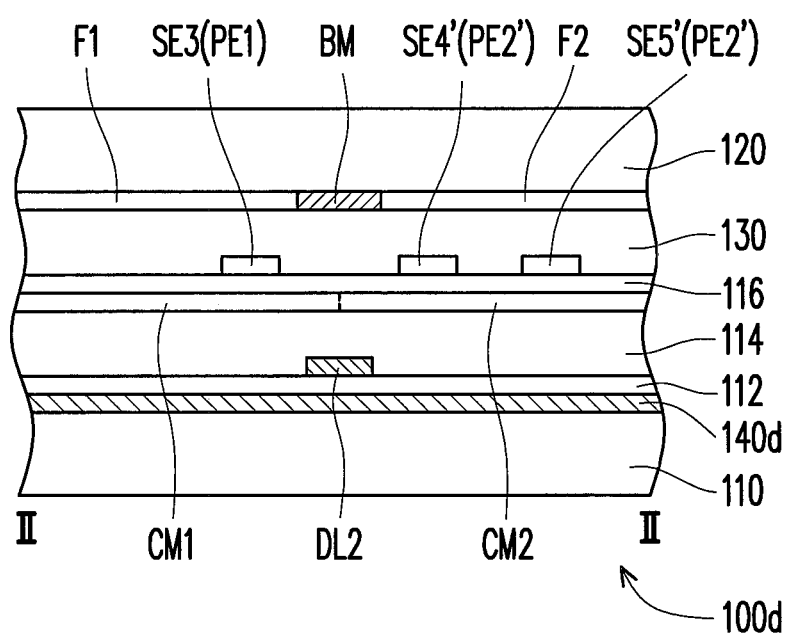
FIG. 4B is a schematic cross-sectional view taken along line II-II in FIG. 4A.

FIG. 4A is a schematic top view of a liquid crystal display panel according to further another embodiment of the present invention. FIG. 4B is a schematic cross-sectional view taken along line II-II in FIG. 4A. Referring to FIG. 4A and FIG. 4B, the liquid crystal display panel 100d of the present embodiment is similar to the liquid crystal display panel 100c of FIG. 3, except that: the common line 140d and the scan lines SL1 and SL2 of the liquid crystal display panel 100d of the present embodiment are belong to the same layer, and the liquid crystal display panel 100d further includes a plurality of contact windows C, such as the two contact windows C in the sub-pixel region P1 and the sub-pixel region P3. With regard to the area of the sub-pixel regions P1 and P3 being greater than that of the sub-pixel region P2', the contact windows C are respectively arranged in the sub-pixel regions P1 and P3 to reduce the variation of aperture ratio caused by difference of area between the sub-pixel regions P1, P2' and P3. By which, the opaque contact windows C can decrease the light transmitting area of the sub-pixel regions P1 and P3, and therefore the aperture ratio of the sub-pixel regions P1 and P3 can be adjusted to be substantially equal to the aperture ratio of the sub-pixel region P2'. In addition, the common line 140d is disposed on the first substrate and extended along the first direction D, wherein the contact windows C are coupled to the corresponding common line 140d and the common electrodes CM1 and CM3, to reduce the overall resistance of the common electrodes CM1, CM2 and CM3.

Figure 5:
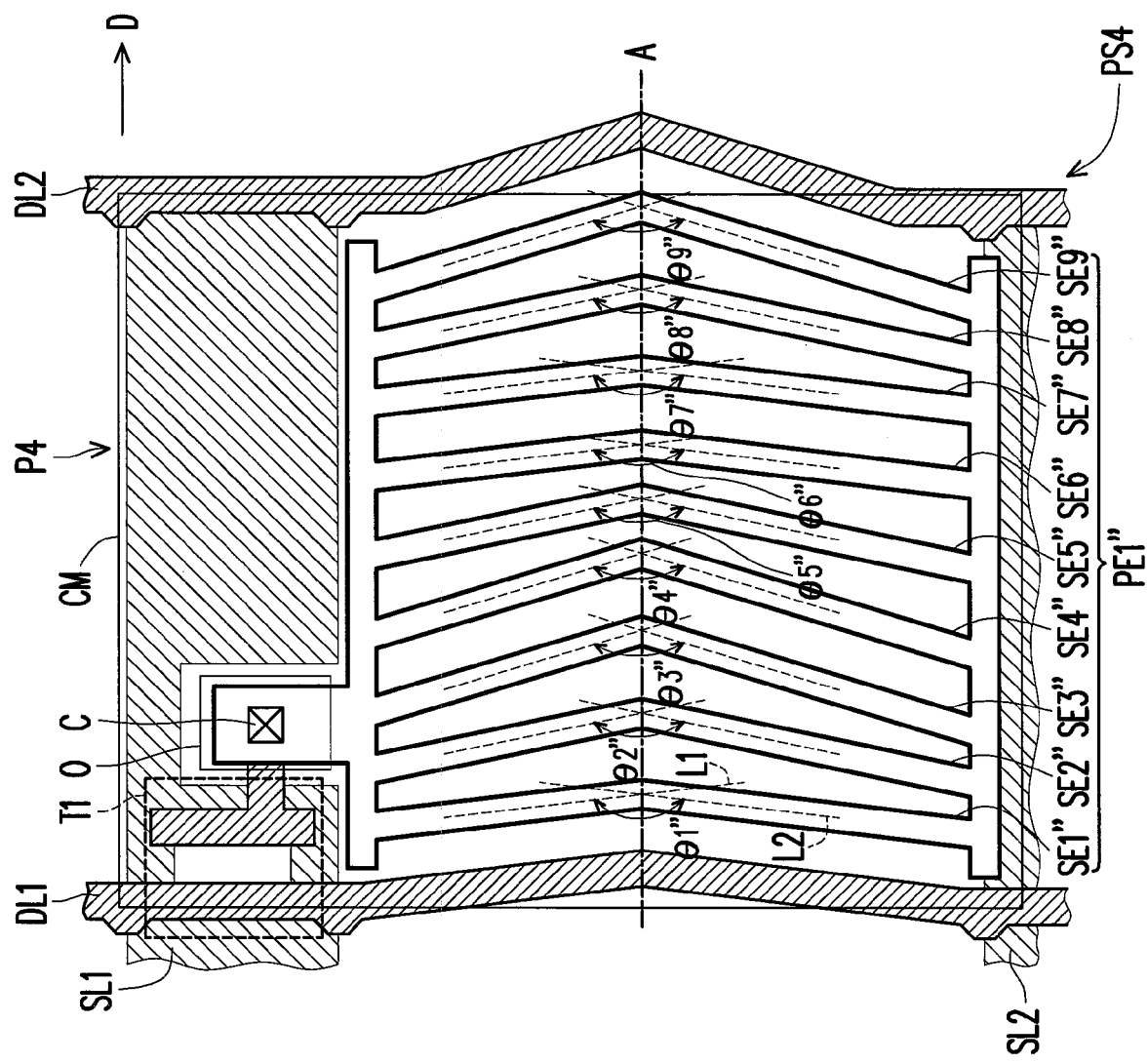
FIG. 5 is a schematic top view of a pixel structure according to an embodiment of the present invention.

FIG. 5 is a schematic top view of a pixel structure according to an embodiment of the present invention. Referring to FIG. 5, the pixel structure PS4 of the present embodiment is similar to the pixel structure PS1 of FIG. 1A, except that: the variation trend of the included angles θ1", θ2", θ3", θ4", θ5", θ6", θ7", θ8" and θ9" of the stripe electrodes SE1", SE2", SE3", SE4", SE5", SE6", SE7", SE8" and SE9" of the pixel electrode PE1" in the sub-pixel region P4 of the present embodiment are gradually decreased and gradually increased along the first direction D, alternately. More specifically, the included angles θ1", θ2", θ3", θ4", θ5", θ6", θ7", θ8" and θ9" in the sub-pixel region P4 of the pixel structure PS4 is gradually decreased and gradually increased, repeatedly. For example, the included angles θ1", θ2", θ3", θ4", θ5", θ6", θ7", θ8" and θ9" are respectively 170 degrees, 166 degrees, 162 degrees, 162 degrees, 166 degrees, 170 degrees, 170 degrees, 166 degrees and 162 degrees. As illustrated in the aforementioned embodiment, the included angles of the outermost stripe electrodes of two adjacent sub-pixels can be identical with each other, such that the variation trend of the included angles from one sub-pixel region to another is continuous. Besides, the common electrode CM has an opening O, such that the contact window C is not in electrical contact with the common electrode CM.

In summary, the stripe electrodes of the pixel electrodes of the present invention are provided with the included angles gradually decreased or increased along the first direction so as to perform color compensation to the pixel structures for reducing color shift in large viewing angle. Thereby, the liquid crystal display panel of the present embodiment can provide favorable display quality. Furthermore, the common line can be selectively provided in the present invention to reduce the overall resistance of the common electrodes. The color filter patterns with different colors can be respectively arranged in specific sub-pixel regions with different areas, to adjust the display effect of the liquid crystal display panel. For example, the green color filter pattern can be arranged in a large sub-pixel region. In addition, the aperture ratio of the sub-pixel region can further be adjusted by arranging contact windows of common lines therein, whereby the aperture ratios of two adjacent sub-pixels can be identical with each other.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A liquid crystal display panel comprising:
   a first substrate;
   a plurality of scan lines disposed on the first substrate and extending along a first direction;
   a plurality of data lines disposed on the first substrate and intersected with the scan lines to define a plurality of sub-pixel regions on the first substrate;
   a plurality of active devices disposed on the first substrate and coupled to the scan lines and the data lines correspondingly; wherein the plurality of sub-pixel regions comprises a first sub-pixel region and a second sub-pixel region adjacent to each other, and the first sub-pixel region and the second sub-pixel region are arranged along the first direction, are separated from each other, and are corresponding to different active devices;
   a plurality of pixel electrodes respectively disposed in the sub-pixel regions and coupled to the corresponding active devices;
   a plurality of common electrodes respectively disposed corresponding to the pixel electrodes, wherein each of the plurality of common electrodes or each of the plurality of pixel electrodes comprises a plurality of stripe electrodes arranged side by side, each of the plurality of stripe electrodes comprises a first section and a second section respectively disposed on two opposite sides of a reference axis along the first direction, a major axis of the first section forms an included angle with a major axis of the second section, and the included angles of the stripe electrodes in each of the plurality of sub-pixel regions are gradually varied with the same interval along the first direction, and wherein the plurality of data lines comprise a first data line corresponding to the first sub-pixel region and a second data line corresponding to the second sub-pixel region, the first data line and the second data line respectively comprise a first section and a second section respectively disposed on two opposite sides of the reference axis, the first data line comprises a first angle formed by a major axis of the first section of the first data line and a major axis of the second section of the first data line, the second data line comprises a second angle formed by a major axis of the first section of the second data line and a major axis of the second section of the second data line, and the first angle and the second angle are different;
   a second substrate; and
   a liquid crystal layer disposed between the first substrate and the second substrate.

2. The liquid crystal display panel of claim 1, wherein a variation trend of the included angles in the first sub-pixel region is opposite to a variation trend of the included angles in the second sub-pixel region.

3. The liquid crystal display panel of claim 2, wherein an outermost stripe electrode in the first sub-pixel region is adjacent to an outermost stripe electrode in the second sub-pixel region, and the included angle of the outermost stripe electrode in the first sub-pixel region is substantially equal to the included angle of the outermost stripe electrode in the second sub-pixel region.

4. The liquid crystal display panel of claim 2, wherein an area of the first sub-pixel region is greater than an area of the second sub-pixel region, and the liquid crystal display panel is provided with a contact window located in the first sub-pixel region.

5. The liquid crystal display panel of claim 4, wherein the aperture ratio of the first sub-pixel region is substantially equal to the aperture ratio of the second sub-pixel region.

6. The liquid crystal display panel of claim 4, further comprising a plurality of common lines disposed on the first substrate and extending along the first direction, wherein the contact window is coupled between the corresponding common line and the corresponding common electrode.

7. The liquid crystal display panel of claim 1, further comprising a plurality of common lines electrically connected to the common electrodes.

8. The liquid crystal display panel of claim 1, wherein the included angles in each of the plurality of sub-pixels are gradually decreased along the first direction.

9. The liquid crystal display panel of claim 1, wherein the included angles in each of the plurality of sub-pixels are gradually decreased and gradually increased along the first direction, alternately.

10. The liquid crystal display panel of claim 1, wherein the reference axis is substantially parallel to the first direction.

11. A pixel structure comprising:
    a substrate;
    a scan line disposed on the substrate and extending along a first direction;
    a data line disposed on the substrate and intersected with the scan line to define a sub-pixel region on the substrate;
    an active device disposed on the substrate and coupled to the scan line and the data line;
    a pixel electrode disposed in the sub-pixel region and electrically connected to the active device; and
    a common electrode disposed corresponding to the pixel electrode, wherein one of the common electrode and the pixel electrode comprises a plurality of stripe electrodes arranged side by side, each of the plurality of stripe electrodes comprises a first section and a second section respectively disposed on two opposite sides of a reference axis, a major axis of the first section forms an included angle with a major axis of the second section, and the included angles of the stripe electrodes are gradually varied with the same interval along the first direction, and wherein each of the included angles of the stripe electrodes in the sub-pixel region is different.

12. The pixel structure of claim 11, wherein the included angles are gradually increased along the first direction.

13. The pixel structure of claim 11, wherein the included angles are gradually increased and gradually decreased along the first direction, alternately.

14. The pixel structure of claim 11, wherein the reference axis is substantially parallel to the first direction.

15. The liquid crystal display panel of claim 1, wherein each of the included angles of the stripe electrodes in each of the sub-pixel region is different.

* * * * *